(12) United States Patent
Raukopf et al.

(10) Patent No.: US 10,247,585 B2
(45) Date of Patent: Apr. 2, 2019

(54) ADAPTER WITH EMBEDDED FILTER COMPONENTS FOR SENSORS

(71) Applicant: Continental Teves AG & Co. oHG, Frankfurt (DE)

(72) Inventors: Svenja Raukopf, Gemünden Felda-Hainbach (DE); Jakob Schillinger, Gaimersheim (DE); Michael Schulmeister, Groß-Zimmern (DE)

(73) Assignee: Continental Teves AG & oHG, Frankfurt (DE)

( * ) Notice: Subject to any disclaimer, the term of this patent is extended or adjusted under 35 U.S.C. 154(b) by 0 days.

(21) Appl. No.: 15/542,825

(22) PCT Filed: Jan. 26, 2016

(86) PCT No.: PCT/EP2016/051571
§ 371 (c)(1),
(2) Date: Jul. 11, 2017

(87) PCT Pub. No.: WO2016/120268
PCT Pub. Date: Aug. 4, 2016

(65) Prior Publication Data
US 2017/0370750 A1 Dec. 28, 2017

(30) Foreign Application Priority Data

Jan. 28, 2015 (DE) .................. 10 2015 201 480

(51) Int. Cl.
*G01D 11/24* (2006.01)
*G01P 1/02* (2006.01)
(Continued)

(52) U.S. Cl.
CPC ............ *G01D 11/245* (2013.01); *G01P 1/026* (2013.01); *H01R 13/6658* (2013.01);
(Continued)

(58) Field of Classification Search
None
See application file for complete search history.

(56) References Cited

U.S. PATENT DOCUMENTS 4,937,656 A * 6/1990 Kohara ............... H01L 23/4951
257/676
6,003,369 A * 12/1999 Tola ........................ G01P 1/026
257/686
(Continued)

FOREIGN PATENT DOCUMENTS

DE 102006030081 A1 2/2007
DE 102005043413 A1 3/2007
(Continued)

OTHER PUBLICATIONS

German Search Report for German Application No. 10 2016 201 096.4, dated Dec. 9, 2016, including partial English translation, 12 pages.
(Continued)

*Primary Examiner* — Clayton E. LaBalle
*Assistant Examiner* — Jas A Sanghera
(74) *Attorney, Agent, or Firm* — RatnerPrestia (57) ABSTRACT

A component for a sensor having a sensor element and having an output interface for the outputting of an electrical signal, which is dependent on a physical variable, from the sensor element to the output interface, including—a circuit with at least one first signal path for receiving the electrical signal from the sensor element and for conducting the electrical signal to the output interface, and a second signal path, which differs from the first signal path, for conducting the electrical signal to the output interface, —wherein an activity of the first signal path or of the second signal path is dependent on a position of the component in the sensor.

11 Claims, 7 Drawing Sheets

(51) Int. Cl.
  *H01R 13/66* (2006.01)
  *H01R 43/16* (2006.01)
  *H01R 43/24* (2006.01)

(52) U.S. Cl.
  CPC ......... *H01R 13/6683* (2013.01); *H01R 43/16* (2013.01); *H01R 43/24* (2013.01); *B81B 2201/02* (2013.01)

(56) References Cited

U.S. PATENT DOCUMENTS

| | | |
|---|---|---|
| 7,965,075 B2 | 6/2011 | Mueller et al. |
| 8,426,930 B2 | 4/2013 | Holzmann et al. |
| 8,492,931 B2 | 7/2013 | Kim et al. |
| 8,671,752 B2 | 3/2014 | Hoefer et al. |
| 8,820,160 B2 | 9/2014 | Doering et al. |
| 9,061,454 B2 | 6/2015 | De Voider et al. |
| 9,316,718 B2 | 4/2016 | Stahlin et al. |
| 9,649,796 B2 | 5/2017 | Panis et al. |
| 9,661,775 B2 | 5/2017 | Schillinger et al. |
| 2003/0110847 A1 | 6/2003 | Kubo et al. |
| 2004/0002236 A1 | 1/2004 | Norman et al. |
| 2004/0207077 A1 | 10/2004 | Leal et al. |
| 2005/0018410 A1* | 1/2005 | Brandenburg ..... H01R 13/6658 361/782 |
| 2009/0288484 A1 | 11/2009 | Selvan et al. |
| 2010/0117171 A1* | 5/2010 | Hesen .................... G01R 33/09 257/421 |
| 2013/0249546 A1 | 9/2013 | David et al. |
| 2014/0015123 A1 | 1/2014 | Bowles et al. |
| 2015/0362339 A1 | 12/2015 | Acker |
| 2016/0013112 A1 | 1/2016 | Ihle et al. |

FOREIGN PATENT DOCUMENTS

| | | |
|---|---|---|
| DE | 102008064047 A1 | 4/2010 |
| DE | 102009001969 A1 | 10/2010 |
| DE | 102010042438 A1 | 7/2011 |
| DE | 102011121412 A1 | 6/2013 |
| DE | 102012206552 A1 | 10/2013 |
| DE | 102013214915 A1 | 1/2014 |
| DE | 102013101732 A1 | 8/2014 |
| DE | 102014201790 A1 | 8/2014 |
| DE | 102014002991 A1 | 10/2014 |
| EP | 2120053 A1 | 11/2009 |
| WO | 2004008577 A2 | 1/2004 |
| WO | 2007060289 A1 | 5/2007 |
| WO | 2008008140 A2 | 1/2008 |
| WO | 2010037810 A1 | 4/2010 |
| WO | 2010139526 A1 | 12/2010 |

OTHER PUBLICATIONS

International Search Report and Written Opinion for International Application No. PCT/EP2016/051571, dated Mar. 18, 2016, 7 pages.
German Search Report for German Application No. 10 2016 201 097.2, dated Dec. 9, 2016, including partial English translation, 12 pages.
International Search Report and Written Opinion for International Application No. PCT/EP2016/051575, dated Apr. 8, 2016, 7 pages.
European Examination Report for European Application No. 16701632.8, dated Jan. 4, 2019 with translation, 7 pages.

* cited by examiner

ADAPTER WITH EMBEDDED FILTER COMPONENTS FOR SENSORS

CROSS REFERENCE TO RELATED APPLICATIONS

This application is the U.S. National Phase Application of PCT International Application No. PCT/EP2016/051571, filed Jan. 26, 2016, which claims priority to German Patent Application No. 10 2015 201 480.0, filed Jan. 28, 2015, the contents of such applications being incorporated by reference herein.

FIELD OF THE INVENTION

The invention relates to a sensor for measuring a physical variable and a control device for a vehicle having the sensor.

BACKGROUND OF THE INVENTION

WO 2010/037810 A1, which is incorporated by reference discloses a sensor for measuring a physical signal. The sensor has a leadframe which, as a circuit carrier, carries the sensor component parts of the sensor and at the same time connects the same together.

SUMMARY OF THE INVENTION

An aspect of the invention aims to improve the known sensor.

According to one aspect of the invention, a module for a sensor having a sensor element and an output interface for outputting an electrical signal which is dependent on a physical variable from the sensor element at the output interface comprises a circuit having at least one first signal path for receiving the electrical signal from the sensor element and for conducting the electrical signal to the output interface, and a second signal path, which differs from the first signal path, for conducting the electrical signal to the output interface, wherein an activity of the first signal path or of the second signal path depends on a position of the module in the sensor.

The module specified is based on the thought that a sensor is generally used in an application-dependent application environment. Thus, it is possible that different control devices in a vehicle, in which the sensor can in principle be used, tap off the signal at different pins of the sensor. Although in this way the sensor element itself can be fabricated in a standardized manner and economically, the sensor itself once more has to be produced in an application-specific and therefore customer-specific manner, which drives up the production costs.

Here, the specified module intervenes with the proposal to route the signals output from the sensor element. For this purpose, the specified module has the different signal paths. Depending on which signal path is active, a corresponding pin on an application arranged above the sensor can be supplied with the electrical signal from the sensor component. By means of simply offsetting the specified module in the sensor, it is thus possible to set the different application-dependent configurations, wherein both the sensor element and the module itself can be fabricated economically in a standardized form.

In a preferred configuration, the output interface of the specified module therefore comprises various output pins, the two signal paths being configured to conduct the electrical signal to different output pins.

In an alternative or additional configuration of the idea previously explained, the different signal paths can also be used to implement different application-dependent functions before the electrical signal is output to the output interface. For this purpose, there is at least one electric component in the module, via which the first and/or the second signal path is led.

The electric component can, for example, be configured to filter interference out of the electrical signal. In this way, the electromagnetic compatibility of a sensor having the specified module can be raised.

In an additional development of the module, the circuit can be encapsulated in an embedding compound. As a result of encapsulating the module, the signal paths and, if appropriate, the electric components, are protected. The module can then be touched without difficulty for the purpose of positioning in the sensor. In addition, mechanical stress on the modules can be reduced, since the modules can be positioned in the embedding compound at points of symmetry which represent so-called neutral fibers, at which the mechanical stress input is low.

In order to achieve the highest possible protection of the electric component parts of the specified module, the specified module should comprise pin areas via which the signal paths are exposed to the outside from the embedding compound in order to make contact with the sensor element and the output interface. All other electric component parts of the specified module can thus be protected from the embedding compound.

In another development of the specified module, the embedding compound can be a resin.

According to a further aspect of the invention, a sensor for measuring a physical variable comprises a sensor element for measuring and outputting an electrical signal which is dependent on the physical variable, a substrate carrying the sensor element and having a conductor track, an output interface for outputting the electrical signal to a higher-order device, and one of the specified modules for conducting the electrical signal from the conductor track of the substrate to the output interface.

According to a further aspect of the invention, a control device for a vehicle for controlling a behavior of the vehicle on the basis of a measured physical variable comprises a specified sensor for measuring the physical variable.

BRIEF DESCRIPTION OF THE DRAWINGS

The above-described properties, features and advantages of this invention and the manner in which these are achieved become clearer and considerably more understandable in conjunction with the following description of the exemplary embodiments, which will be explained in more detail in conjunction with the drawings, in which.

DETAILED DESCRIPTION OF THE PREFERRED EMBODIMENTS

In the figures, the same technical elements are provided with the same designations and are described only once.

Figure 1:
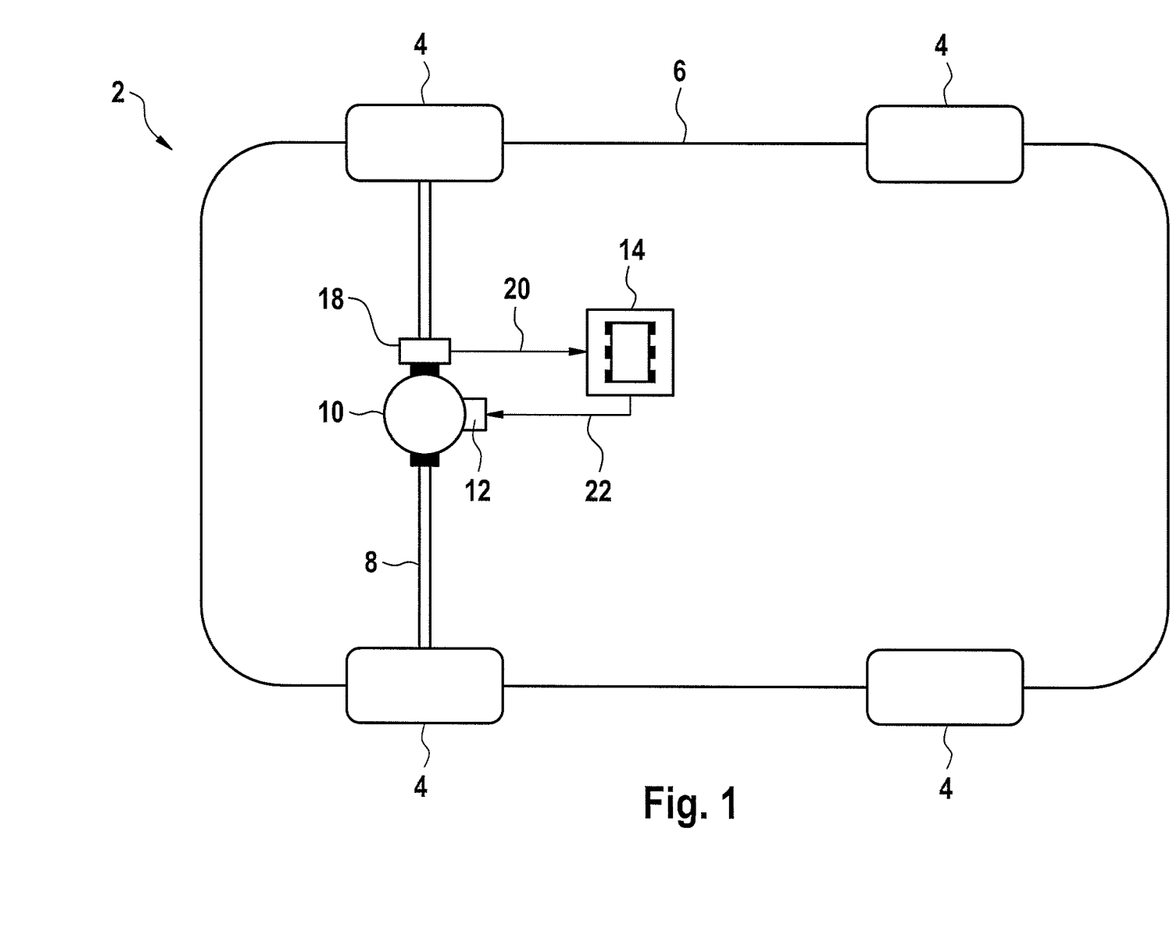
FIG. 1 shows a schematic view of a vehicle having a vehicle dynamic control system.

Reference is made to FIG. 1, which, in schematic form, shows a vehicle 2 having a chassis 6 carried on wheels 4. Two of the wheels 4 are driven via an axle 8 by an internal combustion engine 10. The basic mode of action of an internal combustion engine is known per se and is therefore not to be discussed further below.

In a manner known per se, see for example DE 10 2012 206 552 A1, which is incorporated by reference, the valve control times of the internal combustion engine 10 can be set by a camshaft adjuster 12, in order to influence the load point of the internal combustion engine 10 for better fuel utilization in various rotational speed ranges. For this purpose, a camshaft drive device 14 measures the rotational speed 20 of the internal combustion engine 10 via a rotational speed sensor 18 and, by using a control signal 22, drives the camshaft adjuster 12 on the basis of the measured rotational speed 20. The generation of the control signal 18 on the basis of the rotational speed 20 is known per se and is not to be explained further below. Details relating thereto will be found in the relevant specialist literature.

The rotational speed sensor 18 is formed in a particular way within the context of the present explanation. Before this is discussed in more detail, the basic structure of the rotational speed sensor 18 itself should be explained in more detail. To this end, reference is made to FIG. 2, which shows a schematic view of a possible embodiment of the rotational speed sensor 18 in the motor vehicle 2 from FIG. 1.

Figure 2:
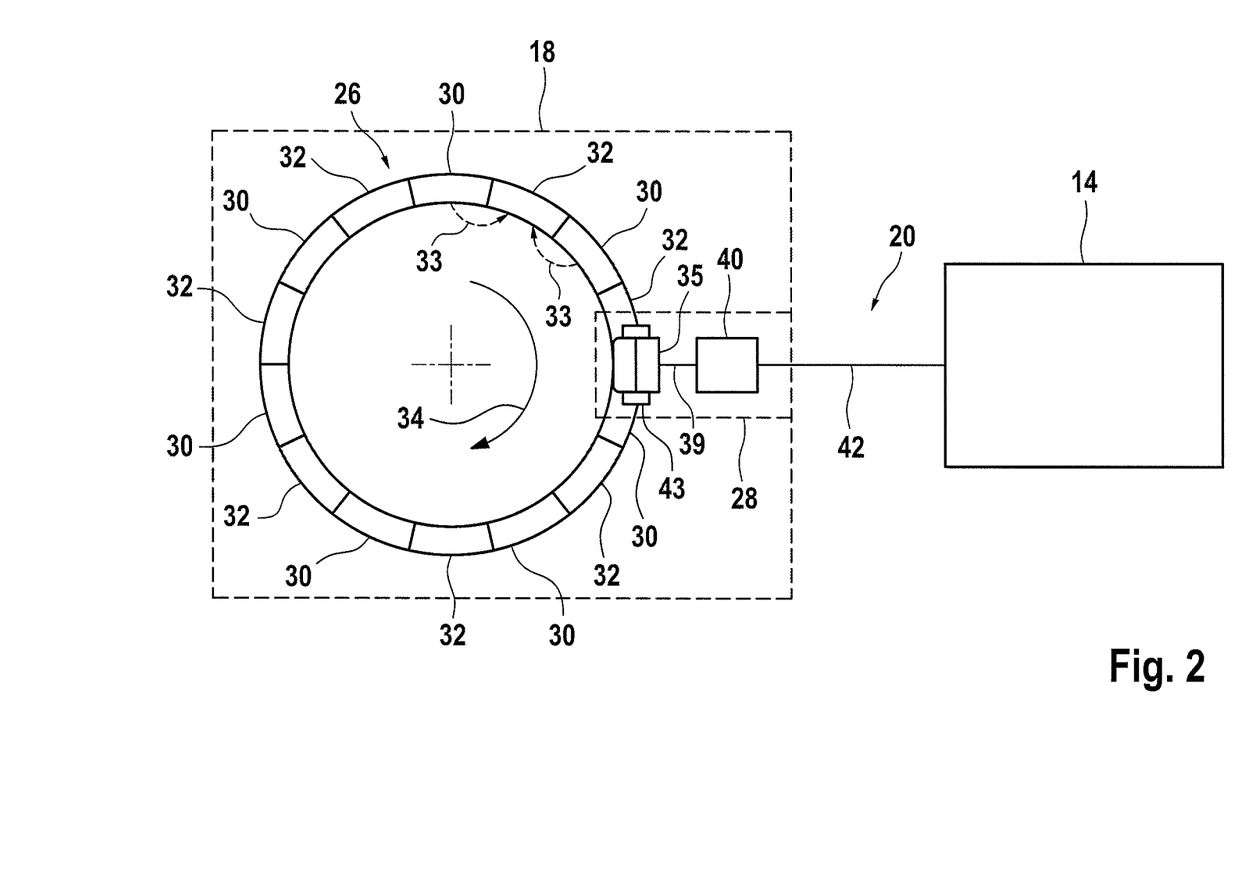
FIG. 2 shows a basic illustration of a rotational speed sensor in the vehicle from FIG. 1.

The rotational speed sensor 18 in the present embodiment is implemented as an active rotational speed sensor which comprises an encoder disk 26 rotationally firmly fixed to the rotor of the internal combustion engine 10 (not shown), and a reading head 28 fixed to the chassis 6 in a fixed location.

The encoder disk 26 in the present embodiment consists of magnetic north poles 30 and magnetic south poles 32 lined up in a row, which jointly excite a magnetic encoder field 33 indicated by an exemplary arrow. If the encoder disk 26 fixed to the rotor of the internal combustion engine 10 rotates with the latter in the direction of rotation 34, then the magnetic encoder field 33 rotates therewith.

The reading head 28 in the present embodiment comprises a measuring sensor 35 which, depending on the movement of the magnetic encoder field 33, generates an electrical transmitter signal 39. For this purpose, it is possible to use any desired measuring principle, such as for example a measuring principle based on the magnetoresistive effect. The electrical transmitter signal 39 therefore depends on the rotational speed 20 that is to be measured.

The transmitter signal 39 can then be conditioned in a signal processing circuit 40 arranged in the reading head 28. As a rule, here a pulse signal 42 is generated from the transmitter signal 39, wherein the pulse signal 42 comprises a number of pulses, which depends on the rotational speed to be measured, over a predetermined time interval. This pulse signal 42 is then output to the camshaft control device 14, which is then able to derive the rotational speed 20 by counting the pulses in the pulse signal 42.

Since, because of the internal combustion engine 10, not inconsiderable interference fields occur in a manner known per se, a supporting magnet 43 is arranged in the reading head 28, counteracting these interference fields and thus permitting a measurement of the rotational speed 20 with low tolerances. The supporting magnet 43 should therefore be chosen to be correspondingly powerful in order to be able to counteract the interference fields adequately.

Conventionally, the reading head 28 is implemented on a leadframe, such as is known, for example, from the prior art WO 2010/037810 A1, which is incorporated by reference, mentioned at the beginning. Such a leadframe is shown by way of example in FIG. 3 and referenced by the designation 44. The leadframe 44 comprises a holding frame 46, a fitting island 48, on which the reading head 28 is held and wired, two dam bars 50 and two contact terminals 52. Here, the dam bars 50 hold the contact terminals 52 directly and the fitting island 48 via an auxiliary frame 53 on the holding frame 46. In the leadframe 44, the holding frame 46, the fitting island 48, the dam bars 50, the contact terminals 52 and the auxiliary frame 53 are formed as one-piece punched parts or punched frames, in which the aforementioned elements are shaped by punching out of an electrically conductive metal sheet.

Figure 3:
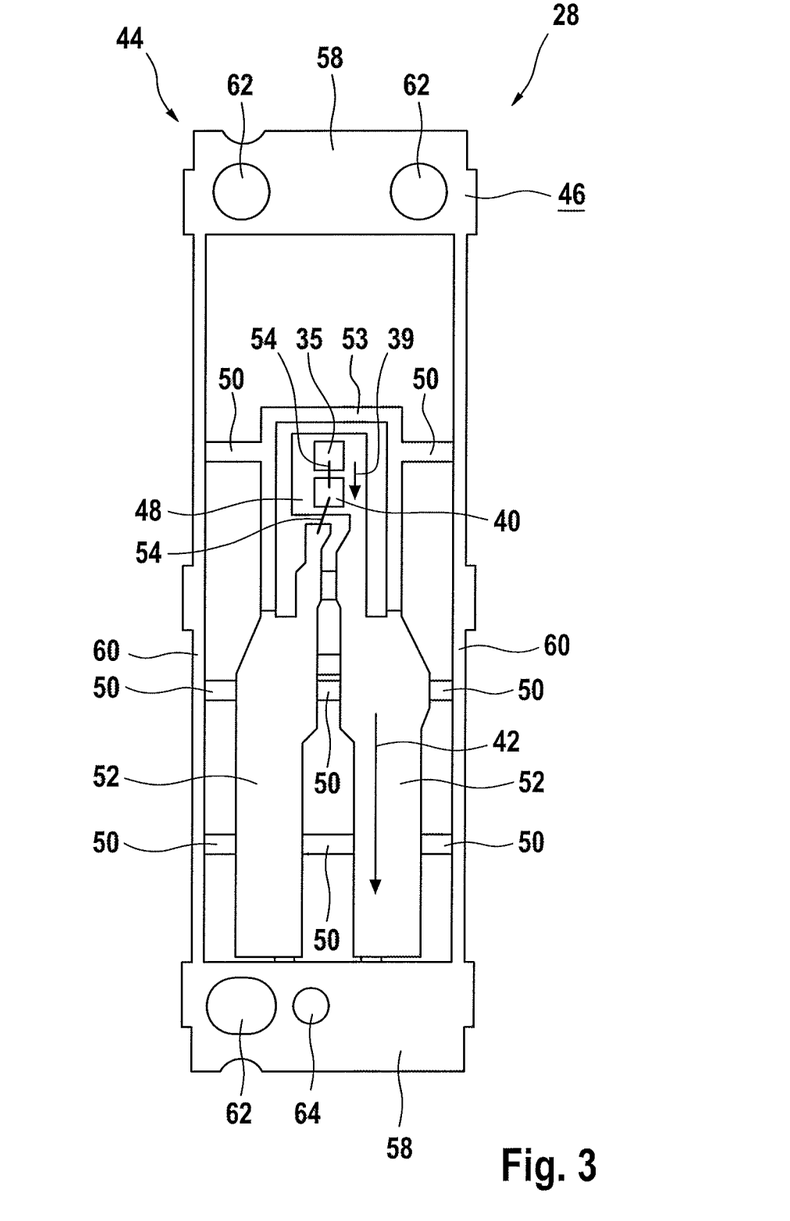
FIG. 3 shows a schematic illustration of a reading head of the rotational speed sensor from FIG. 2 in an intermediate production state.

On the fitting island 48, within the context of the present embodiment, the measuring sensor 35, for example in the form of a magnetoresistive element, and the signal evaluation circuit 40 are applied and electrical contact is made therewith, for example by soldering or adhesive bonding. The measuring sensor 35 and the signal evaluation circuit 40 are also connected to each other via a bonding wire 54, so that the sample signal 39 can be transmitted between measuring sensor 35 and the signal evaluation circuit 40 via the fitting island 48 and the bonding wire 54.

In the present embodiment, the fitting island 48 is connected directly to one of the two contact terminals 52, while the other of the two contact terminals 52 is isolated electrically from the fitting island 48 and is connected to the signal evaluation circuit 40 via a further bonding wire 54. In this way, the data signal 42 can be output from the signal evaluation circuit 40 via the two contact terminals 52.

In the context of the present embodiment, the holding frame 46 has two transport strips 58, which run in parallel with respect to each other and are connected to each other via connecting webs 60. Formed on the transport strips 58 are transport holes 62, in which a transport tool, not specifically illustrated, can engage and move the leadframe 44. Also formed on the transport strips 58 is an index hole 64, by means of which the position of the leadframe 44 can be determined and therefore controlled during transport.

To protect the reading head 28, a housing can be formed around the fitting island 48 carrying the reading head 28 and a part of the contact terminals 52. The housing can, for example, be formed as a protective compound around the reading head 28, for which purpose, for brevity, reference is made to the relevant prior art such as, for example, DE 10 2008 064 047 A1, which is incorporated by reference.

As a rule, however, said reading head 28 not only transmits the pulse signal 42 to the camshaft drive device 14 but also other signals which, for example, can be used for fault detection. In addition, in sensors such as the rotational speed sensor 18 described, measures which increase the electromagnetic compatibility, called EMC, are also necessary.

Depending on the type of the control device receiving the pulse signal 42, such as the camshaft drive device 14, or else also depending on the manufacturer of the latter, the pulse signal 42 must be output on another contact terminal 52.

Figure 4:
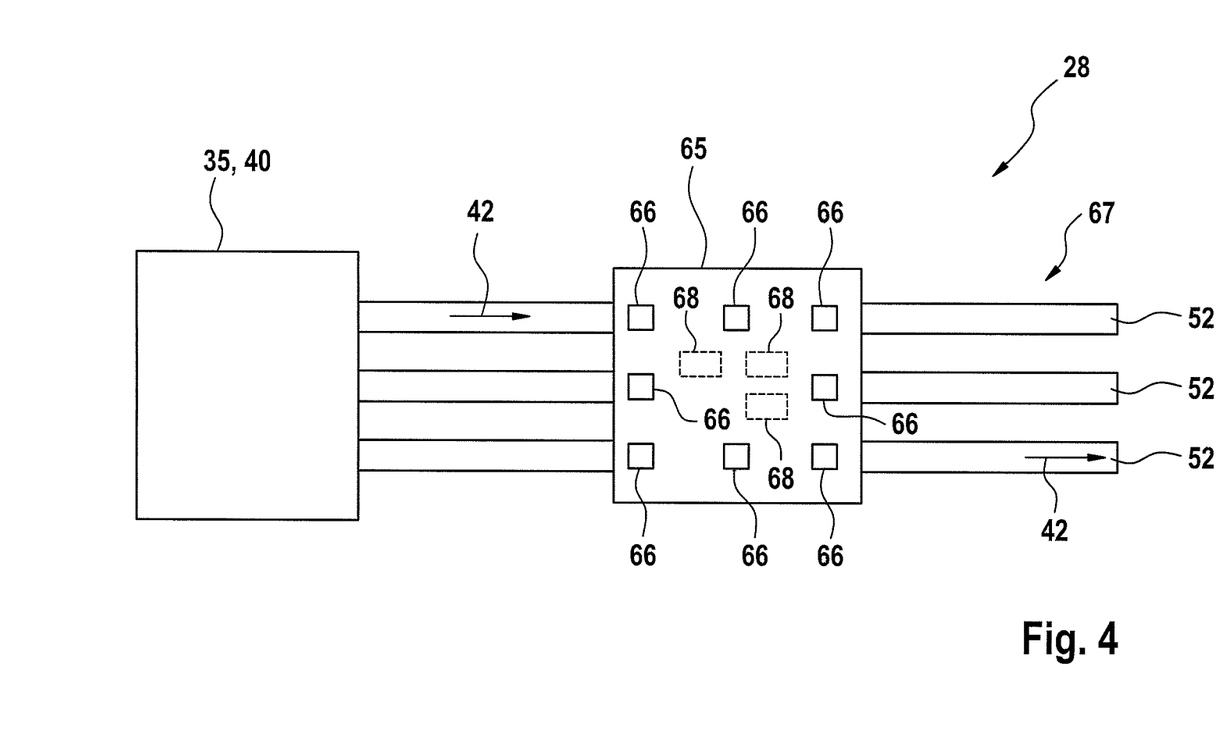
FIG. 4 shows a schematic sectional view of an alternative reading head.
Figure 5:
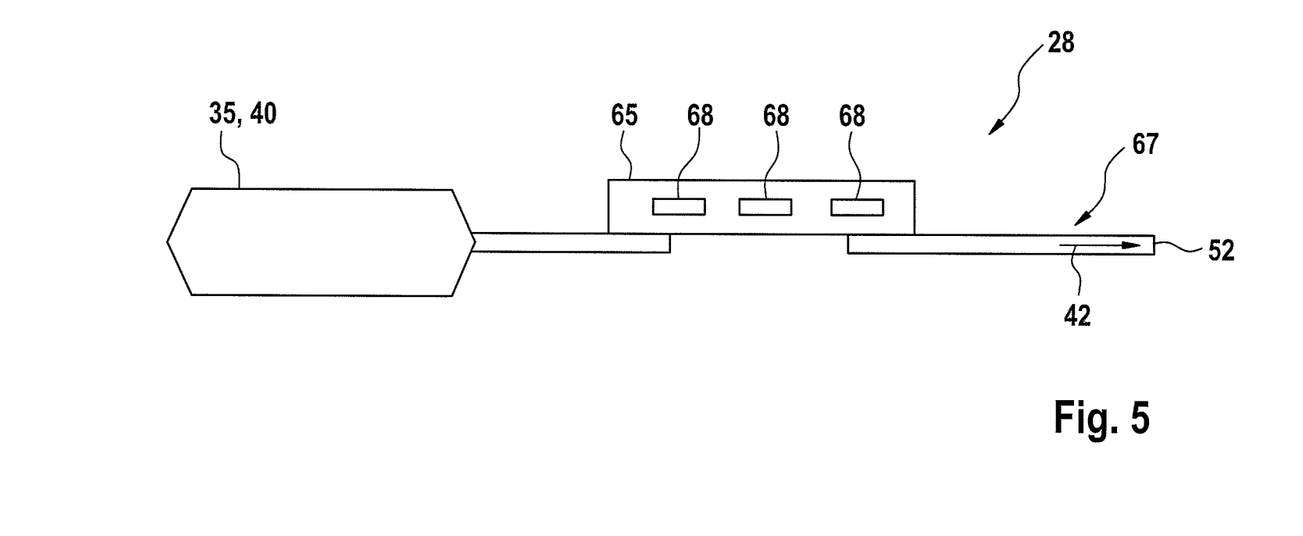
FIG. 5 shows a schematic plan view of the alternative reading head from FIG. 4.

Here, the exemplary embodiment intervenes with the proposal to use a module 65 illustrated in FIGS. 4 and 5 as an adapter and to rewire the individual signals from the reading head 28 into the contact terminals 52 in a corresponding manner. For this purpose, the module 65 has multiple pin areas 66. Each pin area 66 can both receive a signal from the measuring sensor 35 or the signal processing circuit 40 and also output a signal to an output interface 67. The individual pin areas 66 can be wired to one another by signal paths, not specifically illustrated.

The module 65 can have more pin areas 66 than is completely necessary for routing the signals such as the pulse signal 42. In this way, by means of a simple positional change of the module 65 (for example by rotation in FIG. 4), another wiring response of the signals in the reading head 28 can be brought about.

Furthermore, additional components 68, such as filter components, can be wired in the module 65 in order to filter out the aforementioned interference from the signals, such as the pulse signal 42, and thus to increase the EMC. These components 68 can be embedded in the module 65 in the manner below, which is to be explained in more detail by using FIGS. 6 and 7.

Figure 6:
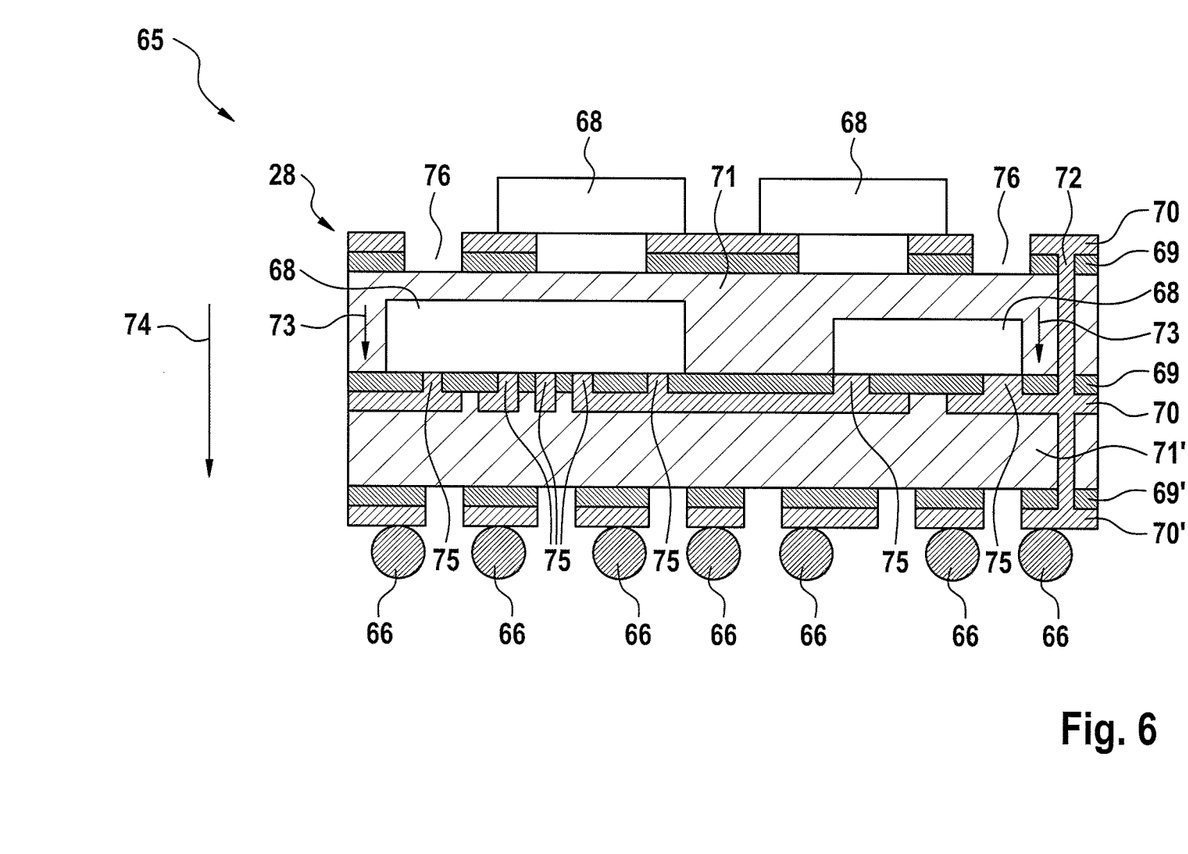
FIG. 6 shows a schematic sectional view of a module from the alternative reading head.

The module 65 can be implemented as a printed circuit board module and comprise multiple insulating layers 69 stacked one above another, to which conductor tracks 70 are applied. The aforementioned components 68 of the module 65, which are intended to increase the electromagnetic compatibility of the reading head 28 and therefore of the rotational speed sensor 18, are carried on the conductor tracks 70 or on the insulating layers 69. The conductor tracks 70 themselves can be part of the aforementioned signal path or implement the latter completely.

Some of the components 68 in the present embodiment are embedded in an embedding compound 71 between two insulating layers 69 of the module 65 implemented as a printed circuit board module. In this way, these components 68 are protected against external influences. The individual layers can be connected electrically to one another via contact-making holes 72. Furthermore, soldering points, which implement the aforementioned pin areas 66, can be present on the module 65.

The embedding according to FIG. 6 should be carried out in a special way. Individual mechanical stress 73 which is brought about by the individual mechanical components 68, for example as a result of temperature movements, and can add up to a total mechanical stress 74, can deform the module 65. As a result of this deformation, amongst other things the soldering points 72 can be detached from the higher-order circuit, and can lead to failure of the reading head 28 and therefore the rotational speed sensor 18.

Therefore, the module 65 should be implemented as symmetrically as possible, in order that the individual mechanical stress 73 brought about by the individual components 68 can be mutually canceled and thus a total mechanical stress 74 can be minimized. For this purpose, there are various compensating components in the module 65, which are able to counteract an individual mechanical stress 73. It is not absolutely necessary to implement all the compensating components shown actually in the module 65 in order to implement the idea behind the embodiment. The individual compensating components shown are intended to illustrate by way of example how the components 68 in the module 65 can be arranged symmetrically in order to keep the total mechanical stress 74 below a specific, tolerable limit.

Firstly, it is possible to introduce, as a compensating component, a redundant conductor track 70' and a redundant insulating layer 69', in order to form the conductor track arrangement symmetrically in the printed circuit board module 66. Consequently, a redundant embedding compound 71' is also introduced here, which can be different from the embedding compound 71 or else chosen to be the same as the latter.

As a further possibility, individual ones of the components 68 can be arranged symmetrically in relation to one another. The advantage here is that no redundant elements have to be introduced into the module 65 as compensating components. In order to compensate differences in the geometric, material or other condition between the two embedded components 68, it is also possible to dimension the contact-making means 75 of the conductor tracks 70 to the individual embedded components 68 geometrically differently, which is indicated in FIG. 6 by contact-making means 75 of different widths on the two embedded components 68.

In addition, redundant recesses 76 can be introduced into the printed circuit board module 66 as compensating components.

Figure 7:
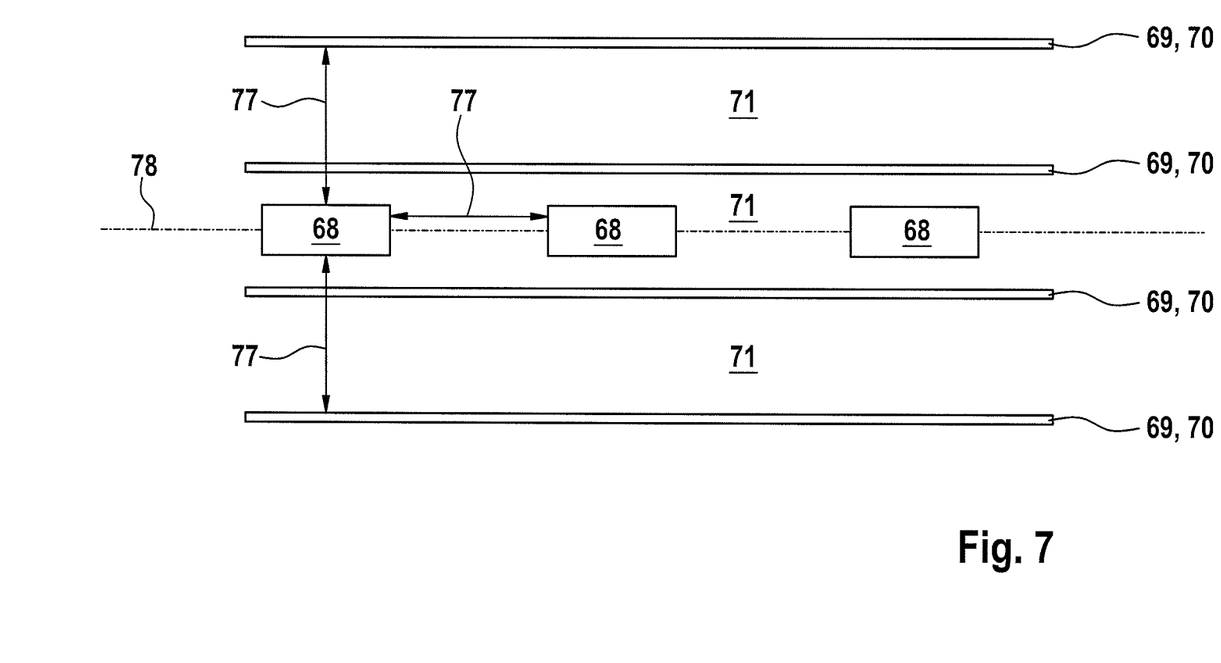
FIG. 7 shows a schematic view of an ideal, theoretical arrangement of various components for the module from FIG. 6.

The ideal case of the module 65 is illustrated in FIG. 7. Here, all the distances 77 between the individual components 68 are implemented symmetrically in relation to one another in relation to an axis of symmetry 78. However, in practical terms this ideal concept cannot be implemented on its own, since the components 68 could then no longer make contact with the conductor tracks 70. However, during the design of the module 65, it should be attempted to reach the ideal case as far as possible.

As a result of embedding the components 68 in the module 65, it is possible to achieve considerable miniaturization. Furthermore, it is not necessary to encase the individual components 68 once more in an extra encapsulation step, for example by pressure injection molding, with the protective compound mentioned above in the context of FIG. 3. As a result of enclosing the entire area of the components with the embedding compound 71, for example in the form of a resin, such a protective compound is obsolete. At the same time, a resin offers better thermal properties for dissipating heat generated by power loss of the component parts as, for example, air convection.

The invention claimed is:

1. A module for a sensor having a sensor element and an output interface for outputting an electrical signal which is dependent on a physical variable from the sensor element at the output interface, comprising:
a circuit having a plurality of signal paths, the plurality of signal paths being larger in number than a number of output connections of the sensor element, the plurality of signal paths including at least one first signal path for receiving the electrical signal from the sensor element and for conducting the electrical signal to the output interface, and a second signal path, which differs from the first signal path, for conducting the electrical signal to the output interface,
wherein an activity of the first signal path or of the second signal path depends on a position of the module in the sensor.

2. The module as claimed in claim 1, wherein the output interface comprises a plurality of output pins larger in number than the number of output connections of the sensor element, and the two signal paths are configured to conduct the electrical signal to different ones of the plurality of output pins.

3. The module as claimed in claim 2, comprising at least one electric component, via which the first and/or the second signal path is/are led.

4. The module as claimed in claim 1, comprising at least one electric component, via which the first and/or the second signal path is/are led.

5. The module as claimed in claim 4, wherein the electric component is configured to filter interference out of the electrical signal.

6. The module as claimed in claim 1, wherein the circuit is encapsulated in an embedding compound.

7. The module as claimed in claim 6, comprising pin areas via which the signal paths are exposed to the outside from the embedding compound in order to make contact with the sensor element and the output interface.

8. The module as claimed in claim 7, wherein the embedding compound is a resin.

9. The module as claimed in claim 6, wherein the embedding compound is a resin.

10. A sensor for measuring a physical variable, comprising:
   a sensor element for measuring an electrical signal which is dependent on the physical variable,
   a substrate carrying the sensor element and having a conductor track,
   an output interface for outputting the electrical signal, and
   the module as claimed in claim 1, for conducting the electrical signal from the conductor track of the substrate to the output interface.

11. A control device for a vehicle for controlling a behavior of the vehicle on the basis of a measured physical variable, comprising the sensor as claimed in claim 10 for measuring the physical variable.

* * * * *